United States Patent [19]
Izumikawa

[11] Patent Number: 6,054,882
[45] Date of Patent: Apr. 25, 2000

[54] CHARGE PUMP CIRCUIT

[75] Inventor: Masanori Izumikawa, Tokyo, Japan

[73] Assignee: NEC Corporation, Tokyo, Japan

[21] Appl. No.: 09/146,103

[22] Filed: Sep. 3, 1998

[30] Foreign Application Priority Data

Sep. 3, 1997 [JP] Japan ..................................... 9-237570

[51] Int. Cl.[7] .................................................... H03L 7/06
[52] U.S. Cl. ........................................... 327/157; 327/148
[58] Field of Search .................................. 327/148, 157, 327/536, 537; 331/15–17

[56] References Cited

U.S. PATENT DOCUMENTS

| | | | |
|---|---|---|---|
| 5,532,636 | 7/1996 | Mar et al. ................................ | 327/543 |
| 5,677,648 | 10/1997 | Jones ....................................... | 331/17 |
| 5,886,551 | 3/1999 | Narahara ................................. | 327/157 |

Primary Examiner—Tuan T. Lam
Attorney, Agent, or Firm—Young & Thompson

[57] ABSTRACT

A charge pump circuit includes a charge pump which includes a first series connection of at least a first conductivity type field effect transistor between a high voltage line and an intermediate point connected to an output terminal; and a second series connection of at least a second conductivity type field effect transistor between a low voltage line and the intermediate point; a replica circuit which includes a third series connection of at least a first conductivity type field effect transistor between the high voltage line and the intermediate point; and a fourth series connection of at least a second conductivity type field effect transistor between the low voltage line and the intermediate point, the replica circuit has substantially the same circuit configuration and characteristics as the charge pump; and a control circuit connected to the charge pump and the replica circuit for controlling the charge pump and the replica circuit, so that an output voltage level of the replica circuit is equal to an output voltage level of the charge pump.

10 Claims, 12 Drawing Sheets

CHARGE PUMP CIRCUIT

BACKGROUND OF THE INVENTION

The present invention relates to a charge pump circuit, and more particularly to a charge pump circuit to be used for a high accurate analog control circuit.

FIG. 1 is a circuit diagram illustrative of a conventional charge pump circuit to be used for an analog control circuit. The conventional charge pump circuit comprises a CMOS circuit which further comprises a series connection of a p-channel MOS field effect transistor 701 and an n-channel MOS field effect transistor 702 between a high voltage line and a ground line. An output terminal is also connected to an intermediate point between the p-channel MOS field effect transistor 701 and the n-channel MOS field effect transistor 702. The p-channel MOS field effect transistor 701 is connected in series between the high voltage line and the intermediate point connected to the output terminal. A gate of the p-channel MOS field effect transistor 701 receives an UP-bar signal. The n-channel MOS field effect transistor 702 is connected in series between the ground line and the intermediate point connected to the output terminal. A gate of the n-channel MOS field effect transistor 702 receives a DOWN signal. Upon input of the UP-bar signal, the p-channel MOS field effect transistor 701 turns ON, whereby an output voltage is risen. Upon input of the DOWN signal, the n-channel MOS field effect transistor 702 turns ON, whereby the output voltage is fallen.

The p-channel MOS field effect transistor 701 and the n-channel MOS field effect transistor 702 have variations in dimension and impurity concentration and others due to manufacturing processes, for which reason the p-channel MOS field effect transistor 701 and the n-channel MOS field effect transistor 702 are different in drain current. Variation in the output voltage or the drain voltage causes variation in drain-source voltage such as a channel length modification, whereby the p-channel MOS field effect transistor 701 and the n-channel MOS field effect transistor 702 are different in drain current.

In Japanese laid-open patent publication No. 6-188728, a second conventional charge pump circuit is disclosed. FIG. 2 is a circuit diagram illustrative of the second conventional charge pump circuit to be used for an analog control circuit, wherein a series connection between a high voltage line and a ground line of a p-channel MOS field effect transistor 711 and an n-channel MOS field effect transistor 712 forms a charge pump. The second conventional charge pump circuit includes a current mirror 713 which controls a gate voltage of the n-channel MOS field effect transistor 712 so as to compensate variations between the p-channel MOS field effect transistor 711 and the n-channel MOS field effect transistor 712. Variation of the output voltage causes that the p-channel MOS field effect transistor 711 and the n-channel MOS field effect transistor 712 are different in drain current.

The conventional charge pump circuits have a problem with a difference between a voltage-rising width and a voltage-falling width even the pulse width remains the same. The reason for the problem is as follows. The p-channel MOS field effect transistor is used for the voltage-rising whilst the n-channel MOS field effect transistor is used for the voltage-falling. The p-channel MOS field effect transistor and the n-channel MOS field effect transistor are different in drain current due to the variations thereof on the manufacturing processes. Further, the p-channel MOS field effect transistor and the n-channel MOS field effect transistor have a difference in drain current de to source-drain voltage such as channel length modulation.

In the above circumstances, it had been required to develop a novel charge pump circuit which is capable of adjusting drain currents to be identical with each other between p-channel and n-channel MOS field effect transistors forming the charge pump circuit, whereby no substantive difference is caused between a voltage-rising width and a voltage-falling width, thereby realizing a highly accurate analog control circuit.

SUMMARY OF THE INVENTION

Accordingly, it is an object of the present invention to provide a novel charge pump circuit free from the above problems.

It is a further object of the present invention to provide a novel charge pump circuit, which is capable of adjusting drain currents to be identical with each other between p-channel and n-channel MOS field effect transistors forming the charge pump circuit.

It is a still further object of the present invention to provide a novel charge pump circuit, which is capable of causing no substantive difference between a voltage-rising width and a voltage-falling width.

It is yet a further object of the present invention to provide a novel charge pump circuit, which is capable of realizing a highly accurate analog control circuit.

The present invention provides a charge pump circuit comprising the following elements. A charge pump comprises: a first series connection of at least a first conductivity type field effect transistor between a high voltage line and an intermediate point connected to an output terminal; and a second series connection of at least a second conductivity type field effect transistor between a low voltage line and the intermediate point. A replica circuit comprises: a third series connection of at least a first conductivity type field effect transistor between the high voltage line and the intermediate point; and a fourth series connection of at least a second conductivity type field effect transistor between the low voltage line and the intermediate point. The replica circuit has substantially the same circuit configuration and characteristics as said charge pump. A control circuit is connected to the charge pump and the replica circuit for controlling the charge pump and the replica circuit, so that an output voltage level of the replica circuit is equal to an output voltage level of the charge pump.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a charge pump circuit comprising the following elements. A charge pump comprises: a first series connection of at least a first conductivity type field effect transistor between a high voltage line and an intermediate point connected to an output terminal; and a second series connection of at least a second conductivity type field effect transistor between a low voltage line and the intermediate point. A replica circuit comprises: a third series connection of at least a first conductivity type field effect transistor between the high voltage line and the intermediate point; and a fourth series connection of at least a second conductivity type field effect transistor between the low voltage line and the intermediate point. The replica circuit has substantially the same circuit configuration and characteristics as said charge pump. A control circuit is connected to the charge pump and the replica circuit for controlling the charge pump and the replica circuit, so that an output voltage level of the replica circuit is equal to an output voltage level of the charge pump.

It is preferable that the control circuit comprises: an operational amplifier having two input terminals connected to output terminals of the replica circuit and the charge pump; and a voltage application means for applying an output voltage from the operational amplifier to input sides of the replica circuit and the charge pump.

It is further preferable that the voltage application means comprises a selector circuit connected between the operational amplifier and each of the replica circuit and the charge pump.

It is furthermore preferable that the first series connection comprises a single first conductivity type field effect transistor. The second series connection comprises a single second conductivity type field effect transistor. The third series connection comprises a single first conductivity type field effect transistor between the high voltage line and the intermediate point. The fourth series connection comprises a single second conductivity type field effect transistor between the low voltage line and the intermediate point.

It is moreover preferable that the voltage application means comprises an electrical connection between the operational amplifier and each of the replica circuit and the charge pump.

It is still more preferable that the first series connection comprises a plurality of first conductivity type field effect transistor. The second series connection comprises a plurality of second conductivity type field effect transistor. The third series connection comprises a plurality of first conductivity type field effect transistor between the high voltage line and the intermediate point. The fourth series connection comprises a plurality of second conductivity type field effect transistor between the low voltage line and the intermediate point.

PREFERRED EMBODIMENTS

Figure 1:
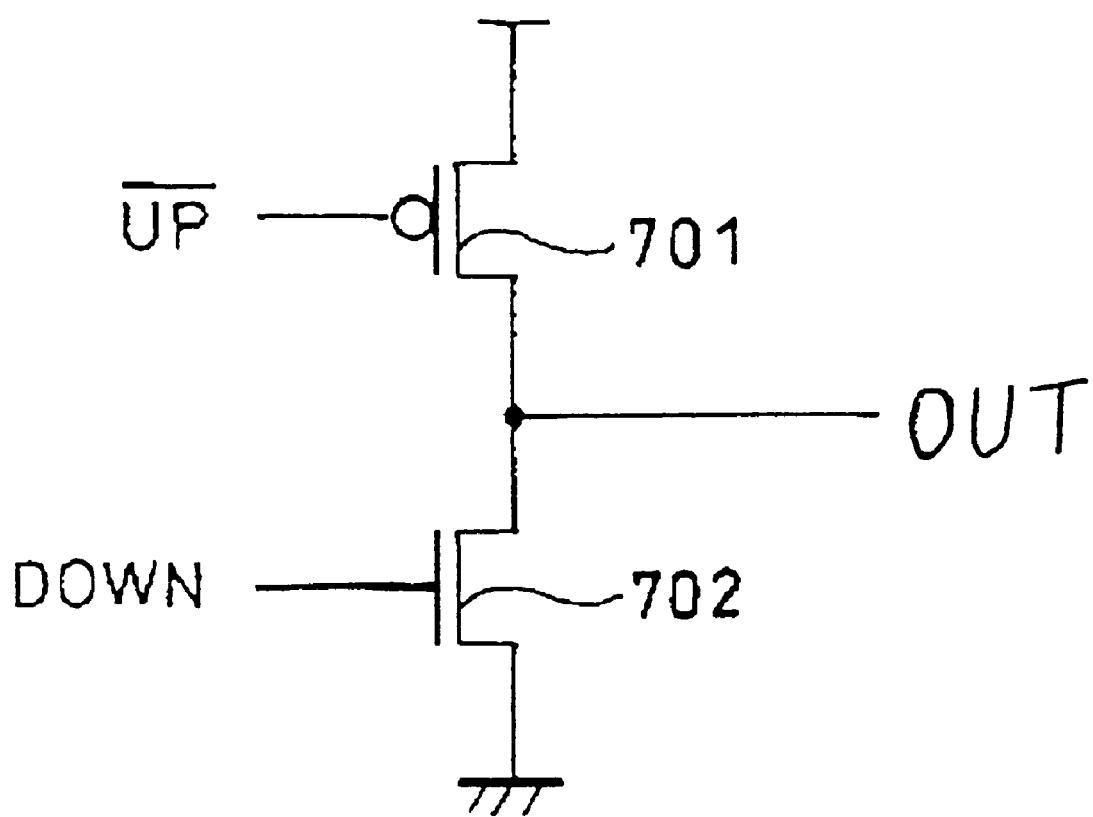
FIG. 1 is a circuit diagram illustrative of the first conventional charge pump circuit to be used for an analog control circuit.
Figure 2:
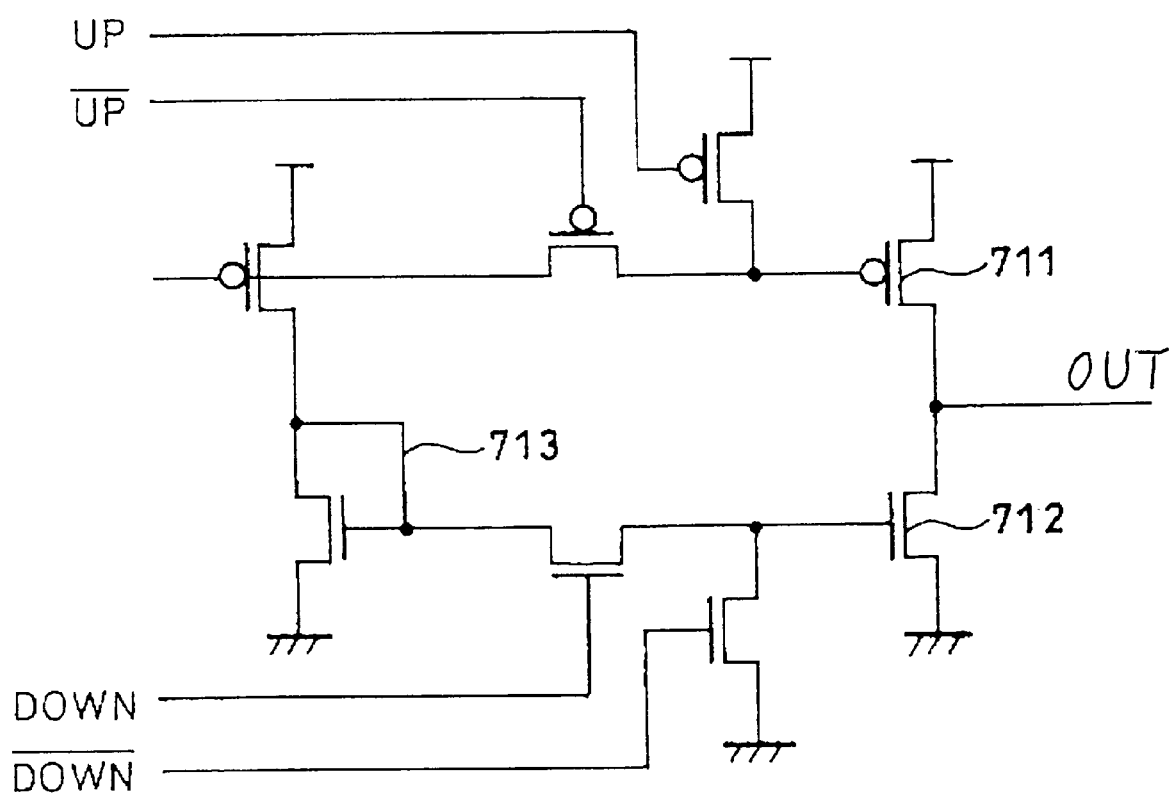
FIG. 2 is a circuit diagram illustrative of the second conventional charge pump circuit to be used for an analog control circuit.
Figure 3:
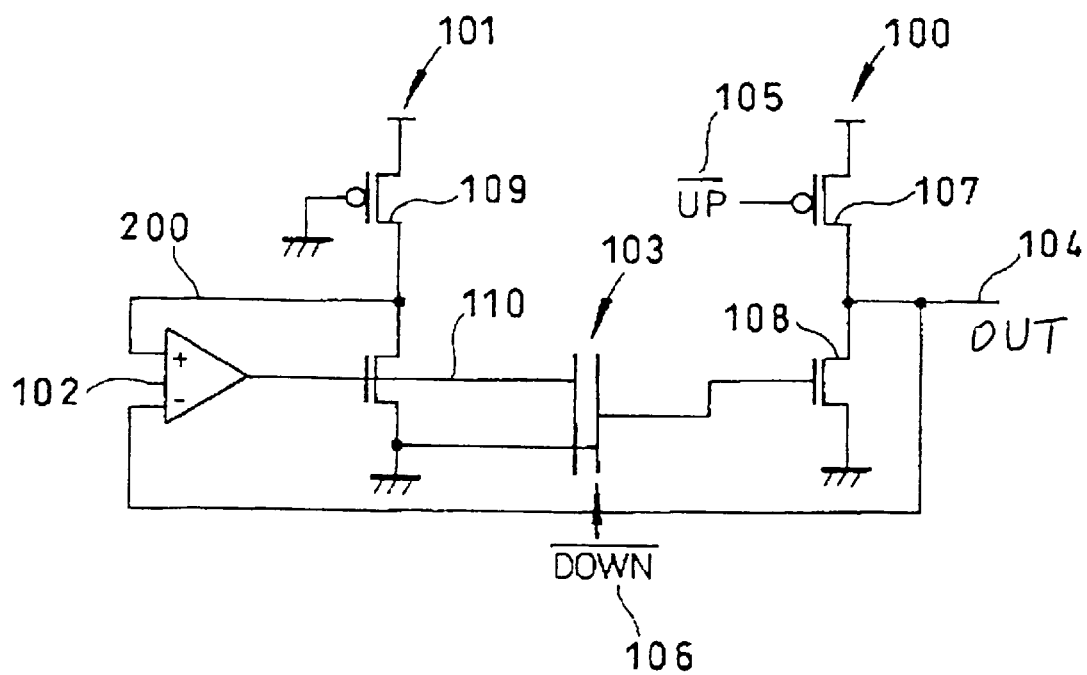
FIG. 3 is a circuit diagram illustrative of a first novel charge pump circuit to be used for a highly accurate analog control circuit in a first embodiment in accordance with the present invention.

First Embodiment:

A first embodiment according to the present invention will be described in detail with reference to FIG. 3 which is a circuit diagram illustrative of a first novel charge pump circuit to be used for a highly accurate analog control circuit. The first novel charge pump circuit comprises a charge pump 100, a replica circuit 101, an operational amplifier 102 and a selector 103.

The charge pump 100 comprises a series connection of a p-channel MOS field effect transistor 107 and an n-channel MOS field effect transistor 108. An output terminal 104 of the first novel charge pump circuit is connected to an intermediate point between the p-channel MOS field effect transistor 107 and the n-channel MOS field effect transistor 108. The p-channel MOS field effect transistor 107 is connected in series between a high voltage line and the intermediate point connected to the output terminal 104. A gate electrode of the p-channel MOS field effect transistor 107 receives an UP-bar input signal 105. The n-channel MOS field effect transistor 108 is connected in series between a ground line and the intermediate point connected to the output terminal 104. A gate electrode of the n-channel MOS field effect transistor 108 is connected to an output side of the selector 103.

The operational amplifier 102 has two input terminals which are connected to the output terminal 104 of the charge pump circuit and an output side of the replica circuit 101. The operational amplifier 102 also has a single output which is connected to an input side of the replica circuit 101 and also connected to an input side of the selector 103.

The replica circuit 101 comprises series connections of a p-channel MOS field effect transistor 109 and an n-channel MOS field effect transistor 110 between the high voltage line and the ground line. The output terminal 200 of the replica circuit 101 is connected to one of the inputs of the operational amplifier 102. The p-channel MOS field effect transistor 109 is connected in series between the high voltage line and the intermediate point connected to the output terminal 200. A gate electrode of the p-channel MOS field effect transistor 109 is connected to the ground line so that the gate electrode is fixed at the ground voltage level. The n-channel MOS field effect transistor 110 is connected in series between the ground line and the intermediate point connected to the output terminal 200. A gate electrode of the n-channel MOS field effect transistor 110 is connected to the output of the operational amplifier 102 for receiving the output signal from the operation amplifier 102.

The selector 103 has two inputs and a single output. One of the two inputs of the selector 103 is connected to the output of the operational amplifier 102 for receiving the output from the operational amplifier 102. Another of the two inputs of the selector 103 is connected to the ground line for receiving the ground voltage. The selector 103 also has an output which is connected to the gate electrode of the n-channel MOS field effect transistor 108 for transmitting the selected signal to the gate electrode of the n-channel MOS field effect transistor 108. The selector 103 receives a DOWN-bar input signal 106 so that the selector 103 exhibits selecting operations in accordance with the DOWN-bar input signal 106. If the DOWN-bar signal 106 is high level, then the selector 103 is operated to select the ground level. If the DOWN-bar signal 106 is low level, then the selector 103 is operated to select the same voltage level as the gate voltage of the n-channel MOS field effect transistor 110 of the replica circuit 101.

The p-channel MOS field effect transistor 107 of the charge pump 100 and the p-channel MOS field effect transistor 109 of the replica circuit 101 have the same characteristics. The n-channel MOS field effect transistor 108 of the charge pump 100 and the n-channel MOS field effect transistor 110 of the replica circuit 101 have the same characteristics.

As described above, the gate electrode of the p-channel MOS field effect transistor 109 of the replica circuit 101 is grounded, whereby the drain current of the p-channel MOS field effect transistor 109 is identical with the drain current of the p-channel MOS field effect transistor 107 when the UP-bar signal of low level is inputted to the gate electrode of the p-channel MOS field effect transistor 107.

Operations of the above charge pump circuit will subsequently be described with reference again to FIG. 3. A gate voltage level of the n-channel MOS field effect transistor 110 of the replica circuit 101 is decided so that the output voltage level of the replica circuit 101 is identical with the output voltage level of the charge pump 100, wherein both drain currents of the p-channel MOS field effect transistor 109 and the n-channel MOS field effect transistor 110 of the replica circuit 101 are identical with each other, the reasons of which are as follows. The p-channel MOS field effect transistor 109 and the n-channel MOS field effect transistor 110 are connected in series between the high voltage line and the ground line. Further, the operational amplifier 102 has the input which has a high impedance and which is connected to the intermediate point between the p-channel MOS field effect transistor 109 and the n-channel MOS field effect transistor 110. For those reasons, almost all of the drain current of the p-channel MOS field effect transistor 109 flows to the n-channel MOS field effect transistor 110 as the drain current.

In order to boost up the charge pump 100, the UP-bar signal 105 becomes low level or ground level to be inputted to the gate electrode of the p-channel MOS field effect transistor 107 of the charge pump 100. At this time, the gate electrode of the p-channel MOS field effect transistor 107 becomes ground level. Further, the gate electrode of the p-channel MOS field effect transistor 109 of the replica circuit 101 is connected to the ground line to be fixed at the ground level. Furthermore, both drain electrodes of the p-channel MOS field effect transistor 107 of the charge pump 100 and the p-channel MOS field effect transistor 109 of the replica circuit 101 are connected to the high voltage line. Both the gate voltage and the drain voltage are the same between the p-channel MOS field effect transistor 107 of the charge pump 100 and the p-channel MOS field effect transistor 109 of the replica circuit 101. For those reasons, the boosting up voltage or the drain current of the p-channel MOS field effect transistor 107 of the charge pump 100 is identical with the drain current of the p-channel MOS field effect transistor 109 of the replica circuit 101.

If the DOWN-bar signal 106 is high level, then the selector 103 is operated to select the ground level, whereby the gate electrode of the n-channel MOS field effect transistor 108 of the charge pump 100 has the ground level. As a result, the n-channel MOS field effect transistor 108 shows no drain current as the voltage-falling current.

If the DOWN-bar signal 106 is low level, then the selector 103 is operated to select the same voltage level as the gate voltage of the n-channel MOS field effect transistor 110 of the replica circuit 101, whereby the gate electrode of the n-channel MOS field effect transistor 108 of the charge pump 100 has the same voltage level as the gate electrode of the n-channel MOS field effect transistor 110 of the replica circuit 101. Further, the drain voltage of the n-channel MOS field effect transistor 108 of the charge pump 100 is identical with the drain voltage of the n-channel MOS field effect transistor 110 of the replica circuit 101. As a result, the drain current as the voltage-falling current of the n-channel MOS field effect transistor 108 of the charge pump 100 is identical with the drain current of the n-channel MOS field effect transistor 110 of the replica circuit 101. Since the drain current of the n-channel MOS field effect transistor 108 is identical with the drain current of the n-channel MOS field effect transistor 110, the voltage-rising current is identical with the voltage-falling current.

Consequently, the voltage-rising current and the voltage-falling current are identical with each other independently from the device variations on the manufacturing processes and also from the channel length modulation.

Figure 4:
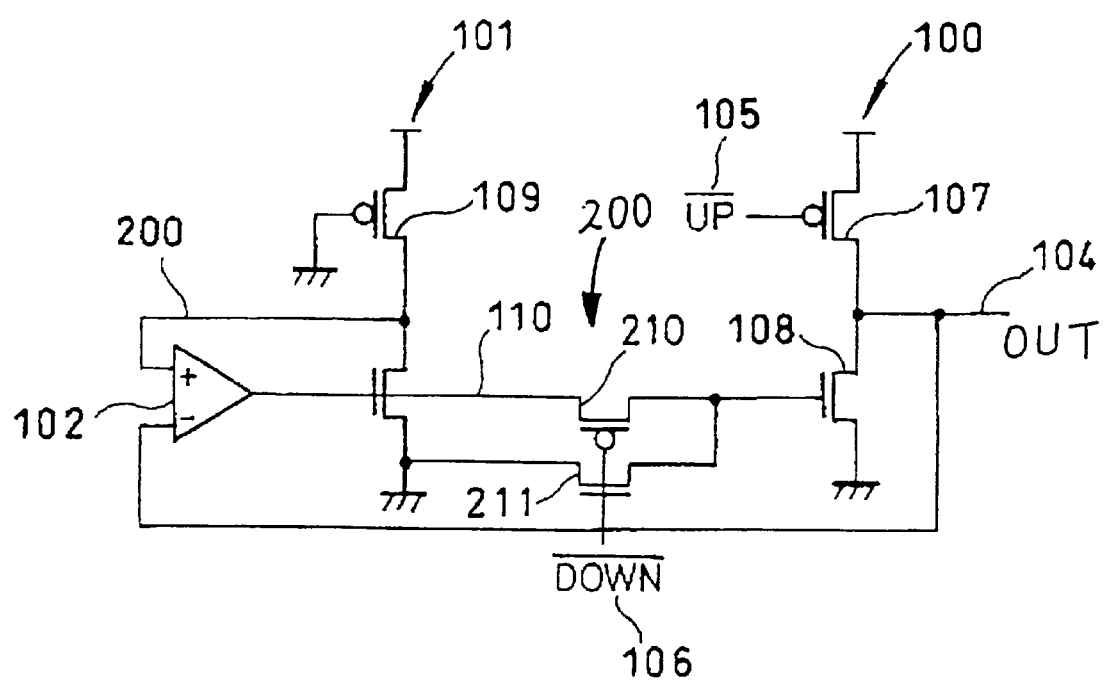
FIG. 4 is a circuit diagram illustrative of a second novel charge pump circuit to be used for a highly accurate analog control circuit in a second embodiment in accordance with the present invention.

Second Embodiment:

A second embodiment according to the present invention will be described in detail with reference to FIG. 4 which is a circuit diagram illustrative of a second novel charge pump circuit to be used for a highly accurate analog control circuit. The second novel charge pump circuit comprises a charge pump 100, a replica circuit 101, an operational amplifier 102 and a selector 200.

The charge pump 100 comprises a series connection of a p-channel MOS field effect transistor 107 and an n-channel MOS field effect transistor 108. An output terminal 104 of the first novel charge pump circuit is connected to an intermediate point between the p-channel MOS field effect transistor 107 and the n-channel MOS field effect transistor 108. The p-channel MOS field effect transistor 107 is connected in series between a high voltage line and the intermediate point connected to the output terminal 104. A gate electrode of the p-channel MOS field effect transistor 107 receives an UP-bar input signal 105. The n-channel MOS field effect transistor 108 is connected in series between a ground line and the intermediate point connected to the output terminal 104. A gate electrode of the n-channel MOS field effect transistor 108 is connected to an output side of the selector 200.

The operational amplifier 102 has two input terminals which are connected to the output terminal 104 of the charge pump circuit and an output side of the replica circuit 101. The operational amplifier 102 also has a single output which is connected to an input side of the replica circuit 101 and also connected to an input side of the selector 200.

The replica circuit 101 comprises series connections of a p-channel MOS field effect transistor 109 and an n-channel MOS field effect transistor 110 between the high voltage line and the ground line. The output terminal 200 of the replica circuit 101 is connected to one of the inputs of the operational amplifier 102. The p-channel MOS field effect transistor 109 is connected in series between the high voltage line and the intermediate point connected to the output terminal 200. A gate electrode of the p-channel MOS field effect transistor 109 is connected to the ground line so that the gate electrode is fixed at the ground voltage level. The n-channel MOS field effect transistor 110 is connected in series between the ground line and the intermediate point connected to the output terminal 200. A gate electrode of the n-channel MOS field effect transistor 110 is connected to the output of the operational amplifier 102 for receiving the output signal from the operation amplifier 102.

The selector 200 comprises a p-channel MOS field effect transistor 210 and an n-channel MOS field effect transistor 211. The p-channel MOS field effect transistor 210 of the selector 200 is connected in series between the gate electrode of the n-channel MOS field effect transistor 110 of the replica circuit 101 and the gate electrode of the n-channel MOS field effect transistor 108 of the charge pump 100. A gate electrode of the p-channel MOS field effect transistor 210 receives the DOWN-bar signal 106. If the DOWN-bar signal 106 is high level, then the p-channel MOS field effect transistor 210 turns OFF. If the DOWN-bar signal 106 is low level, then the p-channel MOS field effect transistor 210 turns ON. The n-channel MOS field effect transistor 211 of the selector 200 is connected in series between the ground line and the gate electrode of the n-channel MOS field effect transistor 108 of the charge pump 100. A gate electrode of the n-channel MOS field effect transistor 211 also receives the DOWN-bar signal 106. If the DOWN-bar signal 106 is high level, then the n-channel MOS field effect transistor 211 turns ON. If the DOWN-bar signal 106 is low level, then the n-channel MOS field effect transistor 211 turns OFF. Namely, if the DOWN-bar signal 106 is high level, then the selector 200 is operated to select the ground level. If the DOWN-bar signal 106 is low level, then the selector 200 is operated to select the same voltage level as the gate voltage of the n-channel MOS field effect transistor 110 of the replica circuit 101.

The p-channel MOS field effect transistor 107 of the charge pump 100 and the p-channel MOS field effect transistor 109 of the replica circuit 101 have the same characteristics. The n-channel MOS field effect transistor 108 of the charge pump 100 and the n-channel MOS field effect transistor 110 of the replica circuit 101 have the same characteristics.

As described above the gate electrode of the p-channel MOS field effect transistor 109 of the replica circuit 101 is grounded, whereby the drain current of the p-channel MOS field effect transistor 109 is identical with the drain current of the p-channel MOS field effect transistor 107 when the UP-bar signal of low level is inputted to the gate electrode of the p-channel MOS field effect transistor 107.

Operations of the above charge pump circuit will subsequently be described with reference again to FIG. 4. A gate voltage level of the n-channel MOS field effect transistor 110 of the replica circuit 101 is decided so that the output voltage level of the replica circuit 101 is identical with the output voltage level of the charge pump 100, wherein both drain currents of the p-channel MOS field effect transistor 109 and the n-channel MOS field effect transistor 110 of the replica circuit 101 are identical with each other, the reasons of which are as follows. The p-channel MOS field effect transistor 109 and the n-channel MOS field effect transistor 110 are connected in series between the high voltage line and the ground line. Further, the operational amplifier 102 has the input which has a high impedance and which is connected to the intermediate point between the p-channel MOS field effect transistor 109 and the n-channel MOS field effect transistor 110. For those reasons, almost all of the drain current of the p-channel MOS field effect transistor 109 flows to the n-channel MOS field effect transistor 110 as the drain current.

In order to boost up the charge pump 100, the UP-bar signal 105 becomes low level or ground level to be inputted to the gate electrode of the p-channel MOS field effect transistor 107 of the charge pump 100. At this time, the gate electrode of the p-channel MOS field effect transistor 107 becomes ground level. Further, the gate electrode of the p-channel MOS field effect transistor 109 of the replica circuit 101 is connected to the ground line to be fixed at the ground level. Furthermore, both drain electrodes of the p-channel MOS field effect transistor 107 of the charge pump 100 and the p-channel MOS field effect transistor 109 of the replica circuit 101 are connected to the high voltage line. Both the gate voltage and the drain voltage are the same between the p-channel MOS field effect transistor 107 of the charge pump 100 and the p-channel MOS field effect transistor 109 of the replica circuit 101. For those reasons, the boosting up voltage or the drain current of the p-channel MOS field effect transistor 107 of the charge pump 100 is identical with the drain current of the p-channel MOS field effect transistor 109 of the replica circuit 101.

If the DOWN-bar signal 106 is high level, then the selector 200 is operated to select the ground level, whereby the gate electrode of the n-channel MOS field effect transistor 108 of the charge pump 100 has the ground level. As a result, the n-channel MOS field effect transistor 108 shows no drain current as the voltage-falling current.

If the DOWN-bar signal 106 is low level, then the selector 200 is operated to select the same voltage level as the gate voltage of the n-channel MOS field effect transistor 110 of the replica circuit 101, whereby the gate electrode of the n-channel MOS field effect transistor 108 of the charge pump 100 has the same voltage level as the gate electrode of the n-channel MOS field effect transistor 110 of the replica circuit 101. Further, the drain voltage of the n-channel MOS field effect transistor 108 of the charge pump 100 is identical with the drain voltage of the n-channel MOS field effect transistor 110 of the replica circuit 101 As a result, the drain current as the voltage-falling current of the n-channel MOS field effect transistor 108 of the charge pump 100 is identical with the drain current of the n-channel MOS field effect transistor 110 of the replica circuit 101. Since the drain current of the n-channel MOS field effect transistor 108 is identical with the drain current of the n-channel MOS field effect transistor 110, the voltage-rising current is identical with the voltage-falling current.

Consequently, the voltage-rising current and the voltage-falling current are identical with each other independently from the device variations on the manufacturing processes and also from the channel length modulation.

Figure 5:
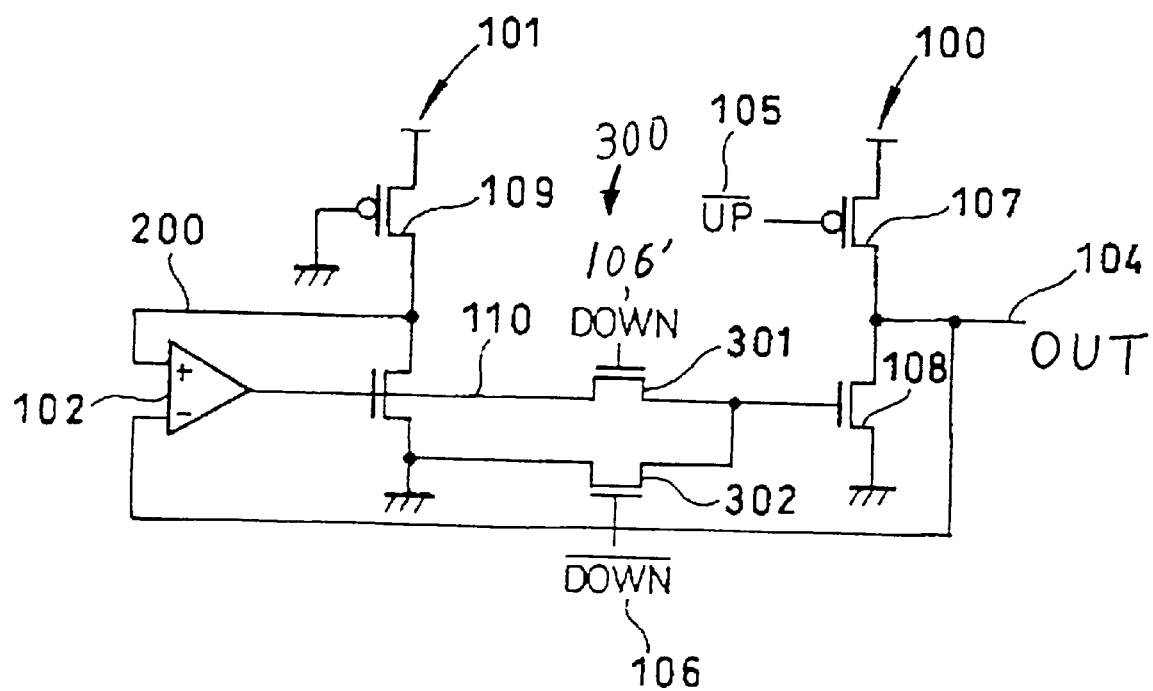
FIG. 5 is a circuit diagram illustrative of a third novel charge pump circuit to be used for a highly accurate analog control circuit in a third embodiment in accordance with the present invention.

Third Embodiment:

A third embodiment according to the present invention will be described in detail with reference to FIG. 5 which is a circuit diagram illustrative of a third novel charge pump circuit to be used for a highly accurate analog control circuit. The third novel charge pump circuit comprises a charge pump 100, a replica circuit 101, an operational amplifier 102 and a selector 300.

The charge pump 100 comprises a series connection of a p-channel MOS field effect transistor 107 and an n-channel MOS field effect transistor 108. An output terminal 104 of the first novel charge pump circuit is connected to an intermediate point between the p-channel MOS field effect transistor 107 and the n-channel MOS field effect transistor 108. The p-channel MOS field effect transistor 107 is connected in series between a high voltage line and the intermediate point connected to the output terminal 104. A gate electrode of the p-channel MOS field effect transistor 107 receives an UP-bar input signal 105. The n-channel MOS field effect transistor 108 is connected in series between a ground line and the intermediate point connected to the output terminal 104. A gate electrode of the n-channel MOS field effect transistor 108 is connected to an output side of the selector 300.

The operational amplifier 102 has two input terminals which are connected to the output terminal 104 of the charge pump circuit and an output side of the replica circuit 101. The operational amplifier 102 also has a single output which is connected to an input side of the replica circuit 101 and also connected to an input side of the selector 300.

The replica circuit 101 comprises series connections of a p-channel MOS field effect transistor 109 and an n-channel MOS field effect transistor 110 between the high voltage line and the ground line. The output terminal 200 of the replica circuit 101 is connected to one of the inputs of the operational amplifier 102. The p-channel MOS field effect transistor 109 is connected in series between the high voltage line and the intermediate point connected to the output terminal 200. A gate electrode of the p-channel MOS field effect transistor 109 is connected to the ground line so that the gate electrode is fixed at the ground voltage level. The n-channel MOS field effect transistor 110 is connected in series between the ground line and the intermediate point connected to the output terminal 200. A gate electrode of the n-channel MOS field effect transistor 110 is connected to the output of the operational amplifier 102 for receiving the output signal from the operation amplifier 102.

The selector 300 comprises an n-channel MOS field effect transistor 301 and an n-channel MOS field effect transistor 302. The n-channel MOS field effect transistor 301 of the selector 300 is connected in series between the gate electrode of the n-channel MOS field effect transistor 110 of the replica circuit 101 and the gate electrode of the n-channel MOS field effect transistor 108 of the charge pump 100. A gate electrode of the n-channel MOS field effect transistor 301 receives the DOWN signal 106'. If the DOWN signal 106' is low level, then the n-channel MOS field effect transistor 301 turns OFF. If the DOWN signal 106' is high level, then the n-channel MOS field effect transistor 301 turns ON. The n-channel MOS field effect transistor 302 of the selector 300 is connected in series between the ground line and the gate electrode of the n-channel MOS field effect transistor 108 of the charge pump 100. A gate electrode of the n-channel MOS field effect transistor 301 also receives the DOWN-bar signal 106. If the DOWN-bar signal 106 is high level, then the n-channel MOS field effect transistor 302 turns ON. If the DOWN-bar signal 106 is low level, then the n-channel MOS field effect transistor 302 turns OFF. Namely, if the DOWN-bar signal 106 is high level and the DOWN signal 106' is low level, then the selector 300 is operated to select the ground level. If the DOWN-bar signal 106 is low level and the DOWN signal 106' is high level, then the selector 300 is operated to select the same voltage level as the gate voltage of the n-channel MOS field effect transistor 110 of the replica circuit 101.

The p-channel MOS field effect transistor 107 of the charge pump 100 and the p-channel MOS field effect transistor 109 of the replica circuit 101 have the same characteristics. The n-channel MOS field effect transistor 108 of the charge pump 100 and the n-channel MOS field effect transistor 110 of the replica circuit 101 have the same characteristics.

As described above, the gate electrode of the p-channel MOS field effect transistor 109 of the replica circuit 101 is grounded, whereby the drain current of the p-channel MOS field effect transistor 109 is identical with the drain current of the p-channel MOS field effect transistor 107 when the UP-bar signal of low level is inputted to the gate electrode of the p-channel MOS field effect transistor 107.

Operations of the above charge pump circuit will subsequently be described with reference again to FIG. 5. A gate voltage level of the n-channel MOS field effect transistor 110 of the replica circuit 101 is decided so that the output voltage level of the replica circuit 101 is identical with the output voltage level of the charge pump 100, wherein both drain currents of the p-channel MOS field effect transistor 109 and the n-channel MOS field effect transistor 110 of the replica circuit 101 are identical with each other, the reasons of which are as follows. The p-channel MOS field effect transistor 109 and the n-channel MOS field effect transistor 110 are connected in series between the high voltage line and the ground line. Further, the operational amplifier 102 has the input which has a high impedance and which is connected to the intermediate point between the p-channel MOS field effect transistor 109 and the n-channel MOS field effect transistor 110. For those reasons, almost all of the drain current of the p-channel MOS field effect transistor 109 flows to the n-channel MOS field effect transistor 110 as the drain current.

In order to boost up the charge pump 100, the UP-bar signal 105 becomes low level or ground level to be inputted to the gate electrode of the p-channel MOS field effect transistor 107 of the charge pump 100. At this time, the gate electrode of the p-channel MOS field effect transistor 107 becomes ground level. Further, the gate electrode of the p-channel MOS field effect transistor 109 of the replica circuit 101 is connected to the ground line to be fixed at the ground level. Furthermore, both drain electrodes of the p-channel MOS field effect transistor 107 of the charge pump 100 and the p-channel MOS field effect transistor 109 of the replica circuit 101 are connected to the high voltage line. Both the gate voltage and the drain voltage are the same between the p-channel MOS field effect transistor 107 of the charge pump 100 and the p-channel MOS field effect transistor 109 of the replica circuit 101. For those reasons, the boosting up voltage or the drain current of the p-channel MOS field effect transistor 107 of the charge pump 100 is identical with the drain current of the p-channel MOS field effect transistor 109 of the replica circuit 101.

If the DOWN-bar signal 106 is high level and the DOWN signal 106' is low level, then the selector 300 is operated to select the ground level, whereby the gate electrode of the n-channel MOS field effect transistor 108 of the charge pump 100 has the ground level. As a result, the n-channel MOS field effect transistor 108 shows no drain current as the voltage-falling current.

If the DOWN-bar signal 106 is low level and the DOWN signal 106' is high level, then the selector 300 is operated to select the same voltage level as the gate voltage of the n-channel MOS field effect transistor 110 of the replica circuit 101, whereby the gate electrode of the n-channel MOS field effect transistor 108 of the charge pump 100 has the same voltage level as the gate electrode of the n-channel MOS field effect transistor 110 of the replica circuit 101. Further, the drain voltage of the n-channel MOS field effect transistor 108 of the charge pump 100 is identical with the drain voltage of the n-channel MOS field effect transistor 110 of the replica circuit 101. As a result, the drain current as the voltage-falling current of the n-channel MOS field effect transistor 108 of the charge pump 100 is identical with the drain current of the n-channel MOS field effect transistor 110 of the replica circuit 101. Since the drain current of the n-channel MOS field effect transistor 108 is identical with the drain current of the n-channel MOS field effect transistor 110, the voltage-rising current is identical with the voltage-falling current.

Consequently, the voltage-rising current and the voltage-falling current are identical with each other independently from the device variations on the manufacturing processes and also from the channel length modulation.

Figure 6:
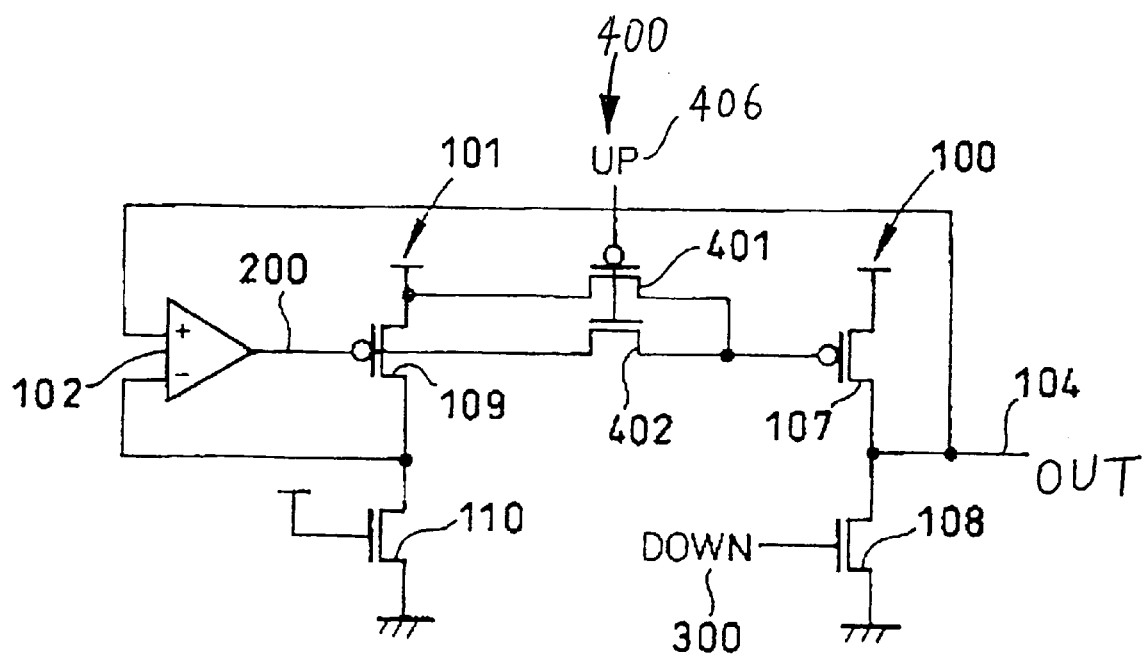
FIG. 6 is a circuit diagram illustrative of a fourth novel charge pump circuit to be used for a highly accurate analog control circuit in a fourth embodiment in accordance with the present invention.

Fourth Embodiment:

A fourth embodiment according to the present invention will be described in detail with reference to FIG. 6 which is a circuit diagram illustrative of a fourth novel charge pump circuit to be used for a highly accurate analog control circuit. The fourth novel charge pump circuit comprises a charge pump 100, a replica circuit 101, an operational amplifier 102 and a selector 400.

The charge pump 100 comprises a series connection of a p-channel MOS field effect transistor 107 and an n-channel MOS field effect transistor 108. An output terminal 104 of the first novel charge pump circuit is connected to an intermediate point between the p-channel MOS field effect transistor 107 and the n-channel MOS field effect transistor 108. The p-channel MOS field effect transistor 107 is connected in series between a high voltage line and the intermediate point connected to the output terminal 104. A gate electrode of the p-channel MOS field effect transistor 107 is connected to an output side of the selector 400. The n-channel MOS field effect transistor 108 is connected in series between a ground line and the intermediate point connected to the output terminal 104. A gate electrode of the n-channel MOS field effect transistor 108 receives a DOWN signal 300.

The operational amplifier 102 has two input terminals which are connected to the output terminal 104 of the charge pump circuit and an output side of the replica circuit 101. The operational amplifier 102 also has a single output which is connected to an input side of the replica circuit 101 and also connected to an input side of the selector 400.

The replica circuit 101 comprises series connections of a p-channel MOS field effect transistor 109 and an n-channel MOS field effect transistor 110 between the high voltage line and the ground line. The output terminal of the replica circuit 101 is connected to one of the inputs of the operational amplifier 102. The p-channel MOS field effect transistor 109 is connected in series between the high voltage line and the intermediate point connected to the one of the inputs of the operational amplifier 102. A gate electrode of the p-channel MOS field effect transistor 109 is connected to the output terminal of the operational amplifier 102. The n-channel MOS field effect transistor 110 is connected in series between the ground line and the intermediate point connected to the one of the inputs of the operational amplifier 102. A gate electrode of the n-channel MOS field effect transistor 110 is connected to the ground line for receiving the ground voltage.

The selector 400 comprises a p-channel MOS field effect transistor 401 and an n-channel MOS field effect transistor 402. The p-channel MOS field effect transistor 401 of the selector 400 is connected in series between the high voltage line and the gate electrode of the n-channel MOS field effect transistor 108 of the charge pump 100. A gate electrode of the p-channel MOS field effect transistor 401 receives the UP signal 406. If the UP signal 406 is high level, then the p-channel MOS field effect transistor 401 turns OFF. If the UP signal 406 is low level, then the p-channel MOS field effect transistor 406 turns ON. The n-channel MOS field effect transistor 402 of the selector 400 is connected in series between the output terminal of the operational amplifier 102 and the gate electrode of the p-channel MOS field effect transistor 107 of the charge pump 100. A gate electrode of the n-channel MOS field effect transistor 402 also receives the UP signal 406. If the UP signal 406 is high level, then the n-channel MOS field effect transistor 402 turns ON. If the UP signal 406 is low level, then the n-channel MOS field effect transistor 402 turns OFF. Namely, if the UP signal 406 is high level, then the selector 400 is operated to select the output voltage level of the output signal from the operational amplifier 102. If the UP signal 406 is low level, then the selector 400 is operated to select the same voltage level as the high voltage of the high voltage line.

The p-channel MOS field effect transistor 107 of the charge pump 100 and the p-channel MOS field effect transistor 109 of the replica circuit 101 have the same characteristics. The n-channel MOS field effect transistor 108 of the charge pump 100 and the n-channel MOS field effect transistor 110 of the replica circuit 101 have the same characteristics.

As described above, the gate electrode of the p-channel MOS field effect transistor 109 of the replica circuit 101 is connected to the output terminal of the operational amplifier 102, whereby the drain current of the p-channel MOS field effect transistor 109 is identical with the drain current of the p-channel MOS field effect transistor 107 when the UP signal 406 of the high level is inputted to the gate electrode of the n-channel MOS field effect transistor 402.

Operations of the above charge pump circuit will subsequently be described with reference again to FIG. 6.

If the UP signal 406 is low level, then the selector 400 is operated to select the high voltage level, whereby the gate electrode of the p-channel MOS field effect transistor 107 of the charge pump 100 has the high voltage level. As a result, the p-channel MOS field effect transistor 107 shows no drain current as the voltage-rising current.

If the UP signal 406 is high level, then the selector 400 is operated to select the output voltage level of the operational amplifier 102, whereby the gate electrode of the p-channel MOS field effect transistor 107 of the charge pump 100 has the same voltage level as the gate electrode of the p-channel MOS field effect transistor 109 of the replica circuit 101. Further, the drain voltage of the p-channel MOS field effect transistor 107 of the charge pump 100 is identical with the drain voltage of the p-channel MOS field effect transistor 109 of the replica circuit 101. As a result, the drain current as the voltage-rising current of the p-channel MOS field effect transistor 107 of the charge pump 100 is identical with the drain current of the p-channel MOS field effect transistor 109 of the replica circuit 101. Since the drain current of the p-channel MOS field effect transistor 107 is identical with the drain current of the p-channel MOS field effect transistor 109, the voltage-rising current is identical with the voltage-falling current.

Consequently, the voltage-rising current and the voltage-falling current are identical with each other independently from the device variations on the manufacturing processes and also from the channel length modulation.

Figure 7:
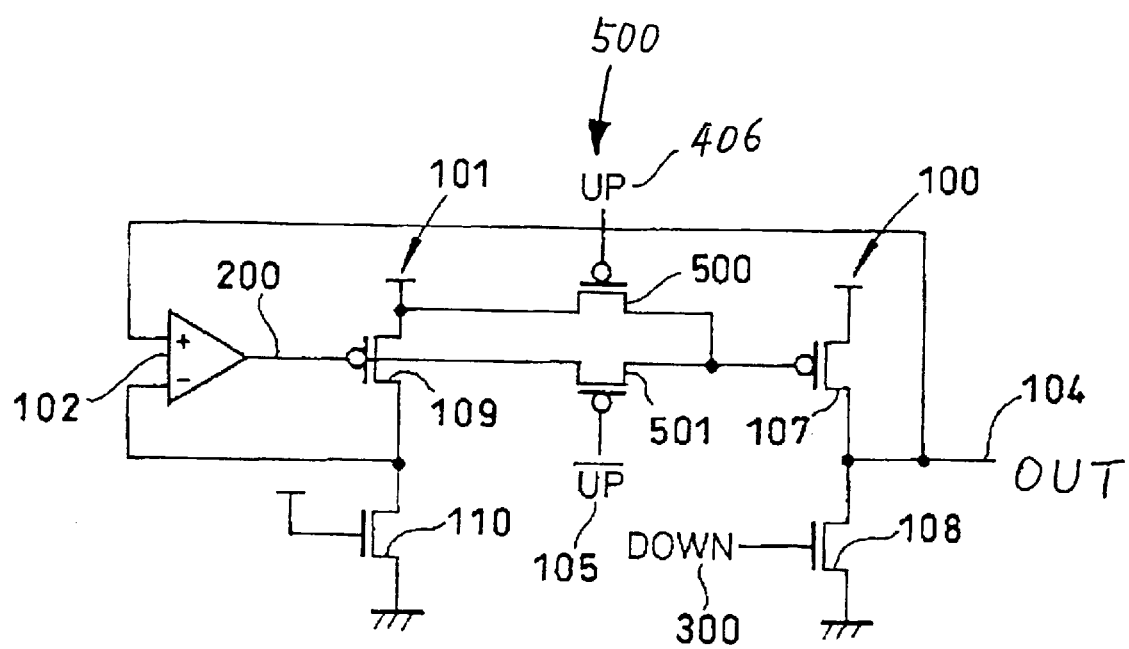
FIG. 7 is a circuit diagram illustrative of a fifth novel charge pump circuit to be used for a highly accurate analog control circuit in a fifth embodiment in accordance with the present invention.

Fifth Embodiment:

A fifth embodiment according to the present invention will be described in detail with reference to FIG. 7 which is a circuit diagram illustrative of a fifth novel charge pump circuit to be used for a highly accurate analog control circuit. The fifth novel charge pump circuit comprises a charge pump 100, a replica circuit 101, an operational amplifier 102 and a selector 500.

The charge pump 100 comprises a series connection of a p-channel MOS field effect transistor 107 and an n-channel MOS field effect transistor 108. An output terminal 104 of the first novel charge pump circuit is connected to an intermediate point between the p-channel MOS field effect transistor 107 and the n-channel MOS field effect transistor 108. The p-channel MOS field effect transistor 107 is connected in series between a high voltage line and the intermediate point connected to the output terminal 104. A gate electrode of the p-channel MOS field effect transistor 107 is connected to an output side of the selector 500. The n-channel MOS field effect transistor 108 is connected in series between a ground line and the intermediate point connected to the output terminal 104. A gate electrode of the n-channel MOS field effect transistor 108 receives a DOWN signal 300.

The operational amplifier 102 has two input terminals which are connected to the output terminal 104 of the charge pump circuit and an output side of the replica circuit 101. The operational amplifier 102 also has a single output which is connected to an input side of the replica circuit 101 and also connected to an input side of the selector 500.

The replica circuit 101 comprises series connections of a p-channel MOS field effect transistor 109 and an n-channel MOS field effect transistor 110 between the high voltage line and the ground line. The output terminal of the replica circuit 101 is connected to one of the inputs of the operational amplifier 102. The p-channel MOS field effect transistor 109 is connected in series between the high voltage line and the intermediate point connected to the one of the inputs of the operational amplifier 102. A gate electrode of the p-channel MOS field effect transistor 109 is connected to the output terminal of the operational amplifier 102. The n-channel MOS field effect transistor 110 is connected in series between the ground line and the intermediate point connected to the one of the inputs of the operational amplifier 102. A gate electrode of the n-channel MOS field effect transistor 110 is connected to the ground line for receiving the ground voltage.

The selector 500 comprises a p-channel MOS field effect transistor 501 and an p-channel MOS field effect transistor 502. The p-channel MOS field effect transistor 501 of the selector 500 is connected in series between the high voltage line and the gate electrode of the n-channel MOS field effect transistor 108 of the charge pump 100. A gate electrode of the p-channel MOS field effect transistor 501 receives the UP signal 406. If the UP signal 406 is high level, then the p-channel MOS field effect transistor 501 turns OFF. If the UP signal 406 is low level, then the p-channel MOS field effect transistor 406 turns ON. The p-channel MOS field effect transistor 502 of the selector 500 is connected in series between the output terminal of the operational amplifier 102 and the gate electrode of the p-channel MOS field effect transistor 107 of the charge pump 100. A gate electrode of the p-channel MOS field effect transistor 502 also receives the UP-bar signal 406'. If the UP-bar signal 406' is low level, then the p-channel MOS field effect transistor 502 turns ON. If the UP-bar signal 406' is high level, then the p-channel MOS field effect transistor 502 turns OFF. Namely, if the UP signal 406 is high level and the UP-bar signal 406' is low level, then the selector 500 is operated to select the output voltage level of the output signal from the operational amplifier 102. If the UP signal 406 is low level and the UP-bar signal 406' is high level, then the selector 500 is operated to select the same voltage level as the high voltage of the high voltage line.

The p-channel MOS field effect transistor 107 of the charge pump 100 and the p-channel MOS field effect transistor 109 of the replica circuit 101 have the same characteristics. The n-channel MOS field effect transistor 108 of the charge pump 100 and the n-channel MOS field effect transistor 110 of the replica circuit 101 have the same characteristics.

As described above, the gate electrode of the p-channel MOS field effect transistor 109 of the replica circuit 101 is connected to the output terminal of the operational amplifier 102, whereby the drain current of the p-channel MOS field effect transistor 109 is identical with the drain current of the p-channel MOS field effect transistor 107 when the UP signal 406 of the high level and the UP-bar signal 406' of the low level are inputted to the gate electrodes of the p-channel MOS field effect transistor 501 and the gate electrodes of the p-channel MOS field effect transistor 502.

Operations of the above charge pump circuit will subsequently be described with reference again to FIG. 7.

If the UP signal 406 is low level and the UP-bar signal 406' is high level, then the selector 500 is operated to select the high voltage level, whereby the gate electrode of the p-channel MOS field effect transistor 107 of the charge pump 100 has the high voltage level. As a result, the p-channel MOS field effect transistor 107 shows no drain current as the voltage-rising current.

If the UP signal 406 is high level and the UP-bar signal 406' is low level, then the selector 500 is operated to select the output voltage level of the operational amplifier 102, whereby the gate electrode of the p-channel MOS field effect transistor 107 of the charge pump 100 has the same voltage level as the gate electrode of the p-channel MOS field effect transistor 109 of the replica circuit 101. Further, the drain voltage of the p-channel MOS field effect transistor 107 of the charge pump 100 is identical with the drain voltage of the p-channel MOS field effect transistor 109 of the replica circuit 101. As a result, the drain current as the voltage-rising current of the p-channel MOS field effect transistor 107 of the charge pump 100 is identical with the drain current of the p-channel MOS field effect transistor 109 of the replica circuit 101. Since the drain current of the p-channel MOS field effect transistor 107 is identical with the drain current of the p-channel MOS field effect transistor 109, the voltage-rising current is identical with the voltage-falling current.

Consequently, the voltage-rising current and the voltage-falling current are identical with each other independently from the device variations on the manufacturing processes and also from the channel length modulation.

Figure 8:
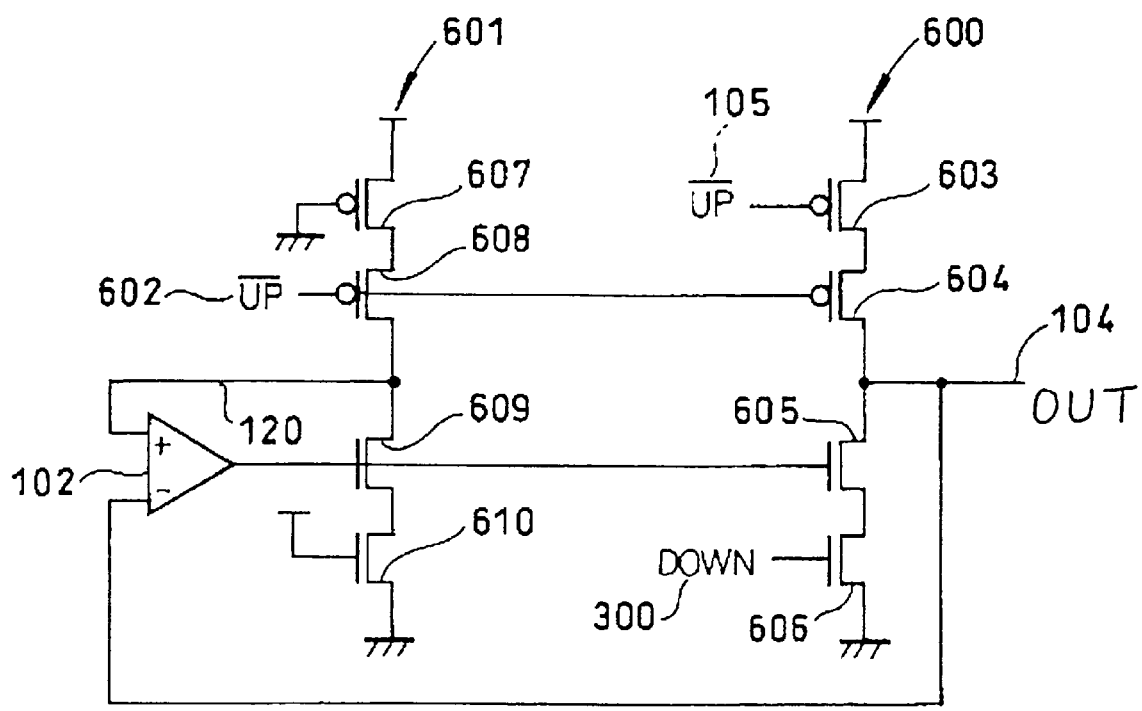
FIG. 8 is a circuit diagram illustrative of a sixth novel charge pump circuit to be used for a highly accurate analog control circuit in a sixth embodiment in accordance with the present invention.

Sixth Embodiment:

A sixth embodiment according to the present invention will be described in detail with reference to FIG. 8 which is a circuit diagram illustrative of a sixth novel charge pump circuit to be used for a highly accurate analog control circuit. The sixth novel charge pump circuit comprises a charge pump 600, a replica circuit 601 and an operational amplifier 102.

The charge pump 600 comprises a series connection of first and second series connections between a high voltage line and a ground line, wherein the first series connection is between the high voltage line and the intermediate point and the second series connection is between the intermediate point and the ground line. The first series connection comprises first and second p-channel MOS field effect transistors 603 and 604 whilst the second series connection comprises first and second n-channel MOS field effect transistors 605 and 606. The first p-channel MOS field effect transistor 603 is connected in series between the high voltage line and the second p-channel MOS field effect transistor 604. The second p-channel MOS field effect transistor 604 is connected in series between the first p-channel MOS field effect transistor 603 and the intermediate point connected to the output terminal 104. The first n-channel MOS field effect transistor 605 is connected in series between the intermediate point connected to the output terminal 104 and the second n-channel MOS field effect transistor 606. The second n-channel MOS field effect transistor 606 is connected in series between the first n-channel MOS field effect transistor 605 and the ground line. A gate electrode of the first p-channel MOS field effect transistor 603 of the charge pump 100 receives an UP-bar signal 105. A gate electrode of the second p-channel MOS field effect transistor 604 of the charge pump 100 receives an UP-bar signal. A gate electrode of the first n-channel MOS field effect transistor 605 of the charge pump 100 connected to an output of the operational amplifier 102. A gate electrode of the second n-channel MOS field effect transistor 606 of the charge pump 100 receives a DOWN signal 300.

The replica circuit 601 comprises a series connection of first and second series connections between the high voltage line and the ground line, wherein the first series connection is between the high voltage line and the intermediate point and the second series connection is between the intermediate point and the ground line. The first series connection comprises first and second p-channel MOS field effect transistors 607 and 608 whilst the second series connection comprises first and second n-channel MOS field effect transistors 609 and 610. The first p-channel MOS field effect transistor 607 is connected in series between the high voltage line and the second p-channel MOS field effect transistor 608. The second p-channel MOS field effect transistor 608 is connected in series between the first p-channel MOS field effect transistor 607 and the intermediate point connected to the output terminal 120. The first n-channel MOS field effect transistor 609 is connected in series between the intermediate point connected to the output terminal 120 and the second n-channel MOS field effect transistor 610. The second n-channel MOS field effect transistor 610 is connected in series between the first n-channel MOS field effect transistor 609 and the ground line. A gate electrode of the first p-channel MOS field effect transistor 607 of the replica circuit 601 is connected to the ground line for receiving the ground voltage. A gate electrode of the second p-channel MOS field effect transistor 608 of the replica circuit 601 receives the UP-bar signal. A gate electrode of the first n-channel MOS field effect transistor 609 of the replica circuit 601 connected to an output of the operational amplifier 102. A gate electrode of the second n-channel MOS field effect transistor 610 of the replica circuit 601 is connected to the high voltage line for receiving the high voltage.

The output terminal 104 of the charge pump 100 is connected to one of two inputs of the operational amplifier 102. The output terminal 120 of the replica circuit 601 is connected to another of the inputs of the operational amplifier 102. The single output of the operational amplifier 102 is connected to both the gate electrode of the first n-channel MOS field effect transistors 609 of the replica circuit 601 and the gate electrode of the first n-channel MOS field effect transistors 605 of the charge pump 100.

Operations of the above charge pump circuit will subsequently be described with reference again to FIG. 8.

If the UP-bar signals 105 and 602 are the low level, then the drain currents of the first and second p-channel MOS field effect transistors 603 and 604 of the charge pump 600 are identical with the drain currents of the first and second p-channel MOS field effect transistors 607 and 608 of the replica circuit 601.

If the DOWN signal is the high level, then the drain currents of the first and second n-channel MOS field effect transistors 605 and 606 of the charge pump 600 are identical with the drain currents of the first and second n-channel MOS field effect transistors 609 and 610 of the replica circuit 601.

The drain currents of the first and second p-channel MOS field effect transistors 607 and 608 of the replica circuit 601 are identical with the drain currents of the first and second n-channel MOS field effect transistors 609 and 610 of the replica circuit 601.

Consequently, the voltage-rising current and the voltage-falling current are identical with each other independently from the device variations on the manufacturing processes and also from the channel length modulation.

Figure 9:
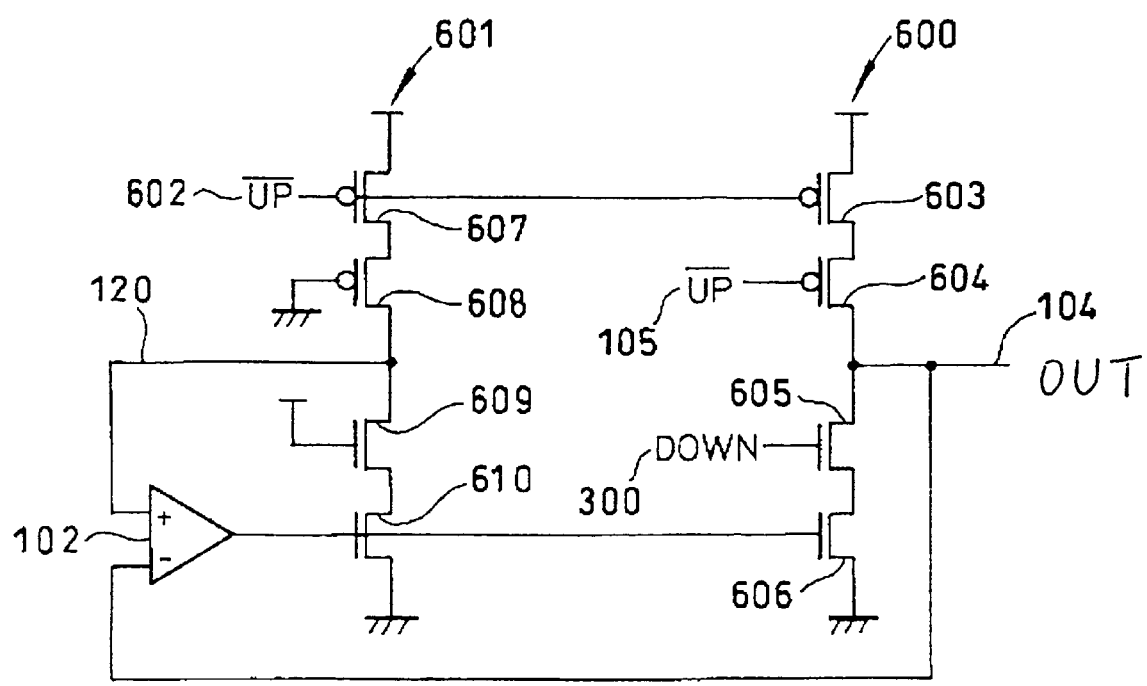
FIG. 9 is a circuit diagram illustrative of a seventh novel charge pump circuit to be used for a highly accurate analog control circuit in a seventh embodiment in accordance with the present invention.

Seventh Embodiment:

A seventh embodiment according to the present invention will be described in detail with reference to FIG. 9 which is a circuit diagram illustrative of a seventh novel charge pump circuit to be used for a highly accurate analog control circuit. The seventh novel charge pump circuit comprises a charge pump 600, a replica circuit 601 and an operational amplifier 102.

The charge pump 600 comprises a series connection of first and second series connections between a high voltage line and a ground line, wherein the first series connection is between the high voltage line and the intermediate point and the second series connection is between the intermediate point and the ground line. The first series connection comprises first and second p-channel MOS field effect transistors 603 and 604 whilst the second series connection comprises first and second n-channel MOS field effect transistors 605 and 606. The first p-channel MOS field effect transistor 603 is connected in series between the high voltage line and the second p-channel MOS field effect transistor 604. The second p-channel MOS field effect transistor 604 is connected in series between the first p-channel MOS field effect transistor 603 and the intermediate point connected to the output terminal 104. The first n-channel MOS field effect transistor 605 is connected in series between the intermediate point connected to the output terminal 104 and the second n-channel MOS field effect transistor 606. The second n-channel MOS field effect transistor 606 is connected in series between the first n-channel MOS field effect transistor 605 and the ground line. A gate electrode of the first p-channel MOS field effect transistor 603 of the charge pump 100 receives an UP-bar signal 105. A gate electrode of the second p-channel MOS field effect transistor 604 of the charge pump 100 receives an UP-bar signal. A gate electrode of the first n-channel MOS field effect transistor 605 of the charge pump 100 receives a DOWN signal 300. A gate electrode of the second n-channel MOS field effect transistor 606 of the charge pump 100 is connected to an output terminal of the operational amplifier 102.

The replica circuit 601 comprises a series connection of first and second series connections between the high voltage line and the ground line, wherein the first series connection is between the high voltage line and the intermediate point and the second series connection is between the intermediate point and the ground line. The first series connection comprises first and second p-channel MOS field effect transistors 607 and 608 whilst the second series connection comprises first and second n-channel MOS field effect transistors 609 and 610. The first p-channel MOS field effect transistor 607 is connected in series between the high voltage line and the second p-channel MOS field effect transistor 608. The second p-channel MOS field effect transistor 608 is connected in series between the first p-channel MOS field effect transistor 607 and the intermediate point connected to the output terminal 120. The first n-channel MOS field effect transistor 609 is connected in series between the intermediate point connected to the output terminal 120 and the second n-channel MOS field effect transistor 610. The second n-channel MOS field effect transistor 610 is connected in series between the first n-channel MOS field effect transistor 609 and the ground line. A gate electrode of the first p-channel MOS field effect transistor 607 of the replica circuit 601 receives the UP-bar signal. A gate electrode of the second p-channel MOS field effect transistor 608 of the replica circuit 601 is connected to the ground line for receiving the ground voltage. A gate electrode of the first n-channel MOS field effect transistor 609 of the replica circuit 601 is connected to the high voltage line for receiving the high voltage. A gate electrode of the second n-channel MOS field effect transistor 610 of the replica circuit 601 is connected to the output of the operational amplifier 102.

The output terminal 104 of the charge pump 100 is connected to one of two inputs of the operational amplifier 102. The output terminal 120 of the replica circuit 601 is connected to another of the inputs of the operational amplifier 102. The single output of the operational amplifier 102 is connected to both the gate electrode of the first n-channel MOS field effect transistors 609 of the replica circuit 601 and the gate electrode of the first n-channel MOS field effect transistors 605 of the charge pump 100.

Operations of the above charge pump circuit will subsequently be described with reference again to FIG. 9.

If the UP-bar signals 105 and 602 are the low level, then the drain currents of the first and second p-channel MOS field effect transistors 603 and 604 of the charge pump 600 are identical with the drain currents of the first and second p-channel MOS field effect transistors 607 and 608 of the replica circuit 601.

If the DOWN signal is the high level, then the drain currents of the first and second in-channel MOS field effect transistors 605 and 606 of the charge pump 600 are identical with the drain currents of the first and second n-channel MOS field effect transistors 609 and 610 of the replica circuit 601.

The drain currents of the first and second p-channel MOS field effect transistors 607 and 608 of the replica circuit 601 are identical with the drain currents of the first and second n-channel MOS field effect transistors 609 and 610 of the replica circuit 601.

Consequently, the voltage-rising current and the voltage-falling current are identical with each other independently from the device variations on the manufacturing processes and also from the channel length modulation.

Figure 10:
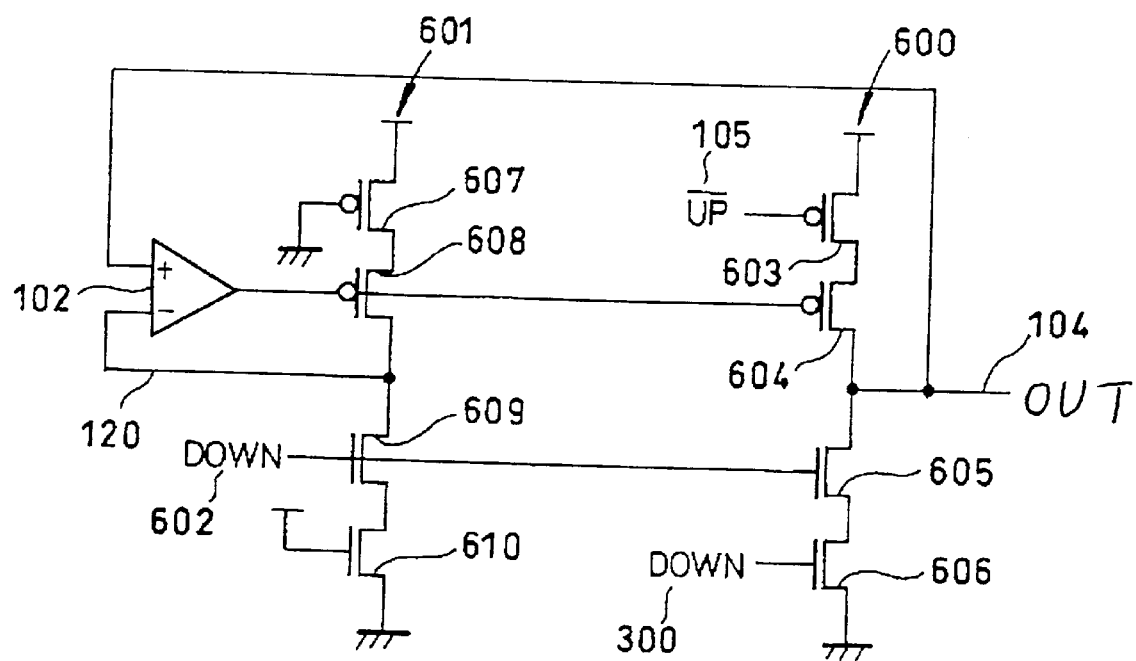
FIG. 10 is a circuit diagram illustrative of an eighth novel charge pump circuit to be used for a highly accurate analog control circuit in an eighth embodiment in accordance with the present invention.

Eighth Embodiment:

An eighth embodiment according to the present invention will be described in detail with reference to FIG. 10 which is a circuit diagram illustrative of an eighth novel charge pump circuit to be used for a highly accurate analog control circuit. The eighth novel charge pump circuit comprises a charge pump 600, a replica circuit 601 and an operational amplifier 102.

The charge pump 600 comprises a series connection of first and second series connections between a high voltage line and a ground line, wherein the first series connection is between the high voltage line and the intermediate point and the second series connection is between the intermediate point and the ground line. The first series connection comprises first and second p-channel MOS field effect transistors 603 and 604 whilst the second series connection comprises first and second n-channel MOS field effect transistors 605 and 606. The first p-channel MOS field effect transistor 603 is connected in series between the high voltage line and the second p-channel MOS field effect transistor 604. The second p-channel MOS field effect transistor 604 is connected in series between the first p-channel MOS field effect transistor 603 and the intermediate point connected to the output terminal 104. The first n-channel MOS field effect transistor 605 is connected in series between the intermediate point connected to the output terminal 104 and the second n-channel MOS field effect transistor 606. The second n-channel MOS field effect transistor 606 is connected in series between the first n-channel MOS field effect transistor 605 and the ground line. A gate electrode of the first p-channel MOS field effect transistor 603 of the charge pump 100 receives an UP-bar signal 105. A gate electrode of the second p-channel MOS field effect transistor 604 of the charge pump 100 is connected to an output terminal of the operational amplifier 102. A gate electrode of the first n-channel MOS field effect transistor 605 of the charge pump 100 receives a DOWN signal 602. A gate electrode of the second n-channel MOS field effect transistor 606 of the charge pump 100 also receives a DOWN signal 300.

The replica circuit 601 comprises a series connection of first and second series connections between the high voltage line and the ground line, wherein the first series connection is between the high voltage line and the intermediate point and the second series connection is between the intermediate point and the ground line. The first series connection comprises first and second p-channel MOS field effect transistors 607 and 608 whilst the second series connection comprises first and second n-channel MOS field effect transistors 609 and 610. The first p-channel MOS field effect transistor 607 is connected in series between the high voltage line and the second p-channel MOS field effect transistor 608. The second p-channel MOS field effect transistor 608 is connected in series between the first p-channel MOS field effect transistor 607 and the intermediate point connected to the output terminal 120. The first n-channel MOS field effect transistor 609 is connected in series between the intermediate point connected to the output terminal 120 and the second n-channel MOS field effect transistor 610. The second n-channel MOS field effect transistor 610 is connected in series between the first n-channel MOS field effect transistor 609 and the ground line. A gate electrode of the first p-channel MOS field effect transistor 607 of the replica circuit 601 is connected to the ground line for receiving the ground voltage. A gate electrode of the second p-channel MOS field effect transistor 608 of the replica circuit 601 is connected to an output of the operational amplifier 102. A gate electrode of the first n-channel MOS field effect transistor 609 of the replica circuit 601 receives the DOWN signal. A gate electrode of the second n-channel MOS field effect transistor 610 of the replica circuit 601 is connected to the high voltage line for receiving the high voltage.

The output terminal 104 of the charge pump 100 is connected to one of two inputs of the operational amplifier 102. The output terminal 120 of the replica circuit 601 is connected to another of the inputs of the operational amplifier 102. The single output of the operational amplifier 102 is connected to both the gate electrode of the first n-channel MOS field effect transistors 609 of the replica circuit 601 and the gate electrode of the first n-channel MOS field effect transistors 605 of the charge pump 100.

Operations of the above charge pump circuit will subsequently be described with reference again to FIG. 10.

If the UP-bar signals 105 and 602 are the low level, then the drain currents of the first and second p-channel MOS field effect transistors 603 and 604 of the charge pump 600 are identical with the drain currents of the first and second p-channel MOS field effect transistors 607 and 608 of the replica circuit 601.

If the DOWN signal is the high level, then the drain currents of the first and second n-channel MOS field effect transistors 605 and 606 of the charge pump 600 are identical with the drain currents of the first and second n-channel MOS field effect transistors 609 and 610 of the replica circuit 601.

The drain currents of the first and second p-channel MOS field effect transistors 607 and 608 of the replica circuit 601 are identical with the drain currents of the first and second n-channel MOS field effect transistors 609 and 610 of the replica circuit 601.

Consequently, the voltage-rising current and the voltage-falling current are identical with each other independently from the device variations on the manufacturing processes and also from the channel length modulation.

Figure 11:
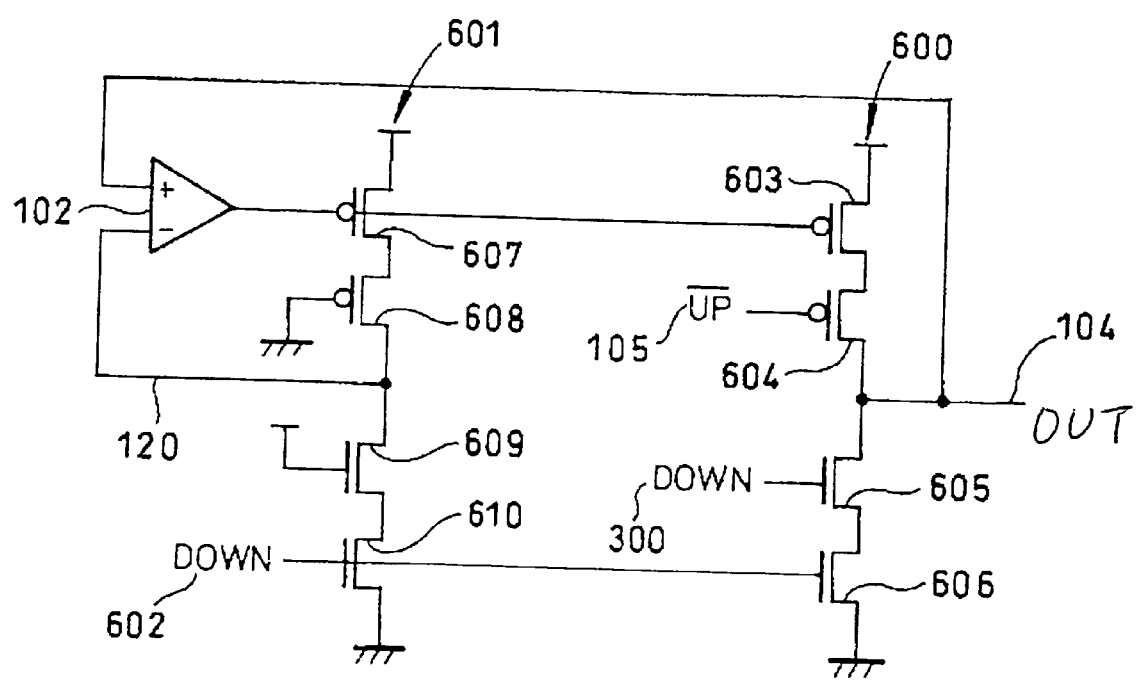
FIG. 11 is a circuit diagram illustrative of a ninth novel charge pump circuit to be used for a highly accurate analog control circuit in a ninth embodiment in accordance with the present invention.

Ninth Embodiment:

A ninth embodiment according to the present invention will be described in detail with reference to FIG. 11 which is a circuit diagram illustrative of a ninth novel charge pump circuit to be used for a highly accurate analog control circuit. The ninth novel charge pump circuit comprises a charge pump 600, a replica circuit 601 and an operational amplifier 102.

The charge pump 600 comprises a series connection of first and second series connections between a high voltage line and a ground line, wherein the first series connection is between the high voltage line and the intermediate point and the second series connection is between the intermediate point and the ground line. The first series connection comprises first and second p-channel MOS field effect transistors 603 and 604 whilst the second series connection comprises first and second n-channel MOS field effect transistors 605 and 606. The first p-channel MOS field effect transistor 603 is connected in series between the high voltage line and the second p-channel MOS field effect transistor 604. The second p-channel MOS field effect transistor 604 is connected in series between the first p-channel MOS field effect transistor 603 and the intermediate point connected to the output terminal 104. The first n-channel MOS field effect transistor 605 is connected in series between the intermediate point connected to the output terminal 104 and the second n-channel MOS field effect transistor 606. The second n-channel MOS field effect transistor 606 is connected in series between the first n-channel MOS field effect transistor 605 and the ground line. A gate electrode of the first p-channel MOS field effect transistor 603 of the charge pump 100 is connected to an output terminal of the operational amplifier 102. A gate electrode of the second p-channel MOS field effect transistor 604 of the charge pump 100 receives an UP-bar signal 105. A gate electrode of the first n-channel MOS field effect transistor 605 of the charge pump 100 receives a DOWN signal 300. A gate electrode of the second n-channel MOS field effect transistor 606 of the charge pump 100 also receives a DOWN signal 602.

The replica circuit 601 comprises a series connection of first and second series connections between the high voltage line and the ground line, wherein the first series connection is between the high voltage line and the intermediate point and the second series connection is between the intermediate point and the ground line. The first series connection comprises first and second p-channel MOS field effect transistors 607 and 608 whilst the second series connection comprises first and second n-channel MOS field effect transistors 609 and 610. The first p-channel MOS field effect transistor 607 is connected in series between the high voltage line and the second p-channel MOS field effect transistor 608. The second p-channel MOS field effect transistor 608 is connected in series between the first p-channel MOS field effect transistor 607 and the intermediate point connected to the output terminal 120. The first n-channel MOS field effect transistor 609 is connected in series between the intermediate point connected to the output terminal 120 and the second n-channel MOS field effect transistor 610. The second n-channel MOS field effect transistor 610 is connected in series between the first n-channel MOS field effect transistor 609 and the ground line. A gate electrode of the first p-channel MOS field effect transistor 607 of the replica circuit 601 is connected to an output of the operational amplifier 102. A gate electrode of the second p-channel MOS field effect transistor 608 of the replica circuit 601 is connected to the ground line for receiving the ground voltage. A gate electrode of the first n-channel MOS field effect transistor 609 of the replica circuit 601 is connected to the high voltage line for receiving the high voltage. A gate electrode of the second n-channel MOS field effect transistor 610 of the replica circuit 601 receives the DOWN signal 602.

The output terminal 104 of the charge pump 100 is connected to one of two inputs of the operational amplifier 102. The output terminal 120 of the replica circuit 601 is connected to another of the inputs of the operational amplifier 102. The single output of the operational amplifier 102 is connected to both the gate electrode of the first n-channel MOS field effect transistors 609 of the replica circuit 601 and the gate electrode of the first n-channel MOS field effect transistors 605 of the charge pump 100.

Operations of the above charge pump circuit will subsequently be described with reference again to FIG. 11.

If the UP-bar signals 105 and 602 are the low level, then the drain currents of the first and second p-channel MOS field effect transistors 603 and 604 of the charge pump 600 are identical with the drain currents of the first and second p-channel MOS field effect transistors 607 and 608 of the replica circuit 601.

If the DOWN signal is the high level, then the drain currents of the first and second n-channel MOS field effect transistors 605 and 606 of the charge pump 600 are identical with the drain currents of the first and second n-channel MOS field effect transistors 609 and 610 of the replica circuit 601.

The drain currents of the first and second p-channel MOS field effect transistors 607 and 608 of the replica circuit 601 are identical with the drain currents of the first and second n-channel MOS field effect transistors 609 and 610 of the replica circuit 601.

Consequently, the voltage-rising current and the voltage-falling current are identical with each other independently from the device variations on the manufacturing processes and also from the channel length modulation.

Figure 12:
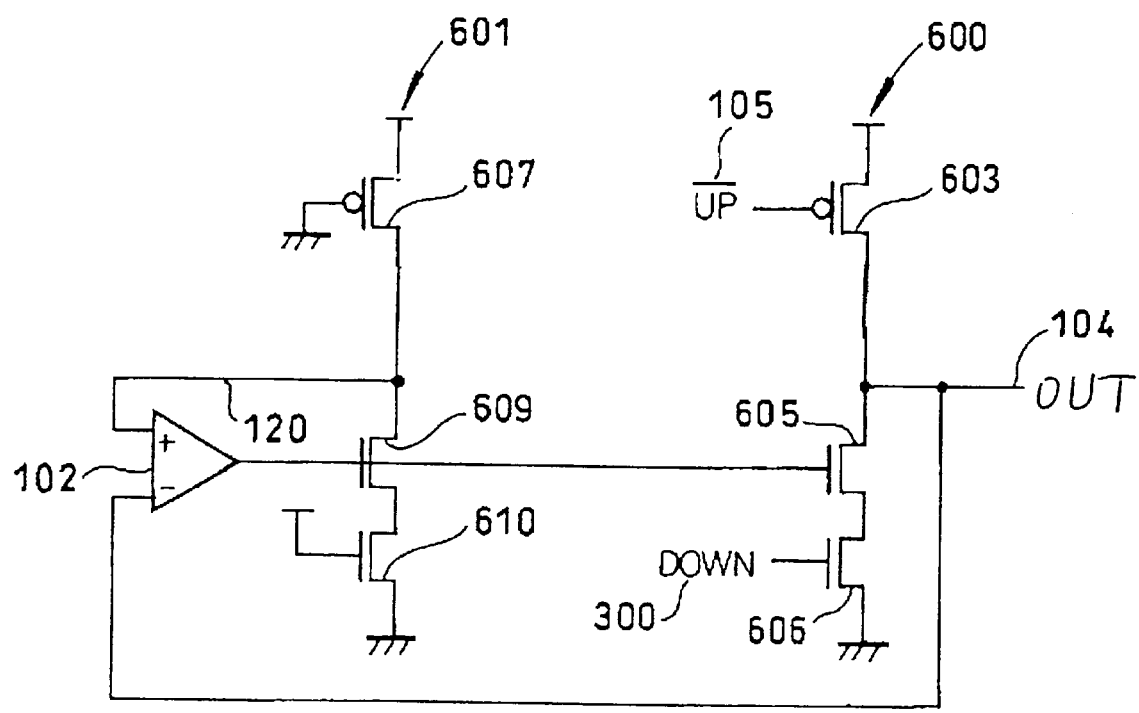
FIG. 12 is a circuit diagram illustrative of a ninth novel charge pump circuit to be used for a highly accurate analog control circuit in a tenth embodiment in accordance with the present invention.

Tenth Embodiment:

A tenth embodiment according to the present invention will be described in detail with reference to FIG. 12 which is a circuit diagram illustrative of a tenth novel charge pump circuit to be used for a highly accurate analog control circuit. The tenth novel charge pump circuit comprises a charge pump 600, a replica circuit 601 and an operational amplifier 102.

The charge pump 600 comprises a series connection, between a high voltage line and a ground line, of a p-channel MOS field effect transistor 603 and a pair of first and second n-channel MOS field effect transistors 605 and 606. The first p-channel MOS field effect transistor 603 is connected in series between the high voltage line and the intermediate point connected to the output terminal 104. The first n-channel MOS field effect transistor 605 is connected in series between the intermediate point connected to the output terminal 104 and the second n-channel MOS field effect transistor 606. The second n-channel MOS field effect transistor 606 is connected in series between the first n-channel MOS field effect transistor 605 and the ground line. A gate electrode of the first p-channel MOS field effect transistor 603 of the charge pump 100 receives an UP-bar signal 105. A gate electrode of the first n-channel MOS field effect transistor 605 of the charge pump 100 connected to an output of the operational amplifier 102. A gate electrode of the second n-channel MOS field effect transistor 606 of the charge pump 100 receives a DOWN signal 300.

The replica circuit 601 comprises a series connection, between the high voltage line and the ground line, of a first p-channel MOS field effect transistor 607 and a pair of first and second n-channel MOS field effect transistors 609 and 610. The first p-channel MOS field effect transistor 607 is connected in series between the high voltage line and the intermediate point connected to the output terminal 120. The first n-channel MOS field effect transistor 609 is connected in series between the intermediate point connected to the output terminal 120 and the second n-channel MOS field effect transistor 610. The second n-channel MOS field effect transistor 610 is connected in series between the first n-channel MOS field effect transistor 609 and the ground line. A gate electrode of the first p-channel MOS field effect transistor 607 of the replica circuit 601 is connected to the ground line for receiving the ground voltage. A gate electrode of the first n-channel MOS field effect transistor 609 of the replica circuit 601 connected to an output of the operational amplifier 102. A gate electrode of the second n-channel MOS field effect transistor 610 of the replica circuit 601 is connected to the high voltage line for receiving the high voltage.

The output terminal 104 of the charge pump 100 is connected to one of two inputs of the operational amplifier 102. The output terminal 120 of the replica circuit 601 is connected to another of the inputs of the operational amplifier 102. The single output of the operational amplifier 102 is connected to both the gate electrode of the first n-channel MOS field effect transistors 609 of the replica circuit 601 and the gate electrode of the first n-channel MOS field effect transistors 605 of the charge pump 100.

Operations of the above charge pump circuit will subsequently be described with reference again to FIG. 12.

If the UP-bar signal 105 is the low level, then the drain current of the first p-channel MOS field effect transistor 603 of the charge pump 600 is identical with the drain current of the first p-channel MOS field effect transistor 607 of the replica circuit 601.

If the DOWN signal is the high level then the drain currents of the first and second n-channel MOS field effect transistors 605 and 606 of the charge pump 600 are identical with the drain currents of the first and second n-channel MOS field effect transistors 609 and 610 of the replica circuit 601.

The drain currents of the first p-channel MOS field effect transistors 607 of the replica circuit 601 is identical with the drain current of the first and second n-channel MOS field effect transistors 609 and 610 of the replica circuit 601.

Consequently, the voltage-rising current and the voltage-falling current are identical with each other independently from the device variations on the manufacturing processes and also from the channel length modulation.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A charge pump circuit comprising:

an output terminal;

a charge pump comprising: a first series connection of at least a first conductivity type field charge pump effect transistor between a high voltage line and an intermediate point connected to said output terminal; and a second series connection of at least a second conductivity type charge pump field effect transistor between a low voltage line and said intermediate point;

a replica circuit comprising a third series connection of at least a first conductivity type replica circuit field effect transistor between said high voltage line and a second intermediate point; and a fourth series connection of at least a second conductivity type replica circuit field effect transistor between said low voltage line and said second intermediate point, and said replica circuit having substantially the same circuit configuration and characteristics as said charge pump; and a control circuit connected to said charge pump and said replica circuit for controlling said charge pump and said replica circuit so that an output voltage level of said replica circuit is equal to an output voltage level of said charge pump, wherein said control circuit comprises:

an operational amplifier having two input terminals connected to output terminals of said replica circuit at said second intermediate point and said charge pump; and a voltage application means for applying an output voltage from said operational amplifier to an input side of said charge pump.

2. The charge pump circuit as claimed in claim 1, wherein said voltage application means comprises a selector circuit connected between said operational amplifier and each of said replica circuit and said charge pump.

3. The charge pump circuit as claimed in claim 2, wherein said first series connection comprises a single charge pump first conductivity type field effect transistor;

wherein said second series connection comprises a single charge pump second conductivity type field effect transistor;

wherein said third series connection comprises a single replica circuit first conductivity type field effect transistor between said high voltage line and said second intermediate point; and wherein the fourth series connection comprises a single second replica circuit conductivity type field effect transistor between said low voltage line and said second intermediate point.

4. The charge pump circuit as claimed in claim 1, wherein said voltage application means comprises an electrical connection between said operational amplifier and each of said replica circuit and said charge pump.

5. The charge pump circuit as claimed in claim 4, wherein said first series connection comprises a plurality of first conductivity type charge pump field effect transistors;

wherein said second series connection comprises a plurality of second conductivity type charge pump field effect transistors;

wherein said third series connection comprises a plurality of first conductivity type replica circuit field effect transistors between said high voltage line and said second intermediate point; and wherein the fourth series connection comprises a plurality of second conductivity type field replica circuit effect transistors between said low voltage line and said second intermediate point.

6. A charge pump circuit comprising:

an output terminal;

a charge pump comprising: a first series connection of at least a first conductivity type field charge pump effect transistor between a high voltage line and an intermediate point connected to said output terminal; and a second series connection of at least a second conductivity type charge pump field effect transistor between a low voltage line and said intermediate point;

a replica circuit comprising a third series connection of at least a first conductivity type replica circuit field effect transistor between said high voltage line and a second intermediate point; and a fourth series connection of at least a second conductivity type replica circuit field effect transistor between said low voltage line and said second intermediate point, and said replica circuit having substantially the same circuit configuration and characteristics as said charge pump; and a control circuit connected to said charge pump and said replica circuit for controlling said charge pump and said replica circuit so that an output voltage level of said replica circuit is equal to an output voltage level of said charge pump, wherein an UP-bar signal of low level is operatively connected to a gate electrode of said first conductivity type charge pump field-effect transistor and a gate of said first conductivity type replica circuit field effect transistor is connected to a low voltage line.

7. The charge pump circuit as claimed in claim 6, wherein said control circuit comprises:

an operational amplifier having two input terminals connected to output terminals of said replica circuit at said second intermediate point and said charge pump; and a voltage application means for applying an output voltage from said operational amplifier to an input side of said charge pump.

8. The charge pump circuit as claimed in claim 7, wherein said voltage application means comprises a selector circuit connected between said operational amplifier and each of said replica circuit and said charge pump.

9. The charge pump circuit as claimed in claim 8, wherein said first series connection comprises a single charge pump first conductivity type field effect transistor;

wherein said second series connection comprises a single charge pump second conductivity type field effect transistor;

wherein said third series connection comprises a single replica circuit first conductivity type field effect transistor between said high voltage line and said second intermediate point; and wherein the fourth series connection comprises a single second replica circuit conductivity type field effect transistor between said low voltage line and said second intermediate point.

10. The charge pump circuit as claimed in claim 6, wherein said voltage application means comprises an electrical connection between said operational amplifier and each of said replica circuit and said charge pump.

* * * * *